(12) United States Patent
Prior

(10) Patent No.: US 6,995,033 B2
(45) Date of Patent: Feb. 7, 2006

(54) METHOD OF FABRICATING AN OPTICAL SEMICONDUCTOR PACKAGE AND OPTICAL SEMICONDUCTOR BOX

(75) Inventor: Christophe Prior, Le Versoud (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/470,174

(22) PCT Filed: Jan. 18, 2002

(86) PCT No.: PCT/FR02/00212

§ 371 (c)(1),
(2), (4) Date: Jun. 30, 2004

(87) PCT Pub. No.: WO02/058107

PCT Pub. Date: Jul. 25, 2002

(65) Prior Publication Data

US 2004/0235217 A1    Nov. 25, 2004

(30) Foreign Application Priority Data

Jan. 22, 2001 (FR) .................................. 01 00816

(51) Int. Cl.
*H01L 21/00* (2006.01)
(52) U.S. Cl. .............................. 438/60; 438/30; 438/75
(58) Field of Classification Search .................. 438/60, 438/22, 25, 26, 27, 29, 30, 42, 55, 64, 65, 438/75, 69, 106, 107, 108
See application file for complete search history.

(56) References Cited

U.S. PATENT DOCUMENTS

| 4,760,440 A | * | 7/1988 | Bigler et al. ................. 257/680 |
| 4,855,808 A | * | 8/1989 | Tower et al. ................. 257/698 |
| 5,352,852 A | * | 10/1994 | Chun ......................... 174/52.4 |

* cited by examiner

*Primary Examiner*—David Nhu
(74) *Attorney, Agent, or Firm*—Lisa K. Jorgenson; Stephen Bongini; Fleit, Kain, Gibbons, Gutman, Bongini & Bianco P.L.

(57) ABSTRACT

Method of fabricating an optical semiconductor package and optical semiconductor package containing an integrated circuit chip having on a front face an optical sensor and electrical connection regions distributed around this sensor, in which a transparent patch (6) lies in front of the front face of the chip without covering the electrical connection regions of this chip, plates (2, 7) defining between them a cavity (10) in which the said chip and the said patch are stacked and which have annular assembly faces (2a, 7a), electrical connection pads (15) are placed between the said electrical connection regions and one face (12) of the said cavity, electrical connection tracks (14) are carried by a plate (7) and lie on the said face (12) of the cavity in order to be in contact with the said pads, an adhesive layer (18) flying between the said assembly faces (2a, 7a), the said tracks (14) protruding in order to pass between the assembly faces of the said plates with a view to external connections and the plate located at the side of the said patch comprising an aperture located opposite the optical sensor.

7 Claims, 2 Drawing Sheets

METHOD OF FABRICATING AN OPTICAL SEMICONDUCTOR PACKAGE AND OPTICAL SEMICONDUCTOR BOX

CROSS-REFERENCE TO RELATED APPLICATIONS

This application is based upon and claims priority from prior French Patent Application No. 01/00816, filed Jan. 22, 2001, the entire disclosure of which is herein incorporated by reference.

This application is a 371 of PCT/FR02/00212 Jan. 18, 2002.

BACKGROUND OF THE INVENTION

1. Field of the Invention

The present invention relates to the field of packaging integrated circuit chips or components having an optical sensor and the field of optical semiconductor packages containing such chips.

2. Description of Related Art

In the prior art, optical chips are fitted in the bottom of the cavity of encapsulation packages which have a connected lid made of a transparent material, the bottom wall of the package being used to provide the external electrical connections of the component. Such arrangements are bulky and expensive.

SUMMARY OF THE INVENTION

The purpose of the present invention is in particular to improve and simplify optical semiconductor devices especially with the aim of reducing their size arid their production cost, while providing protection for the chips.

Firstly, the subject of the present invention is a method of fabricating an optical semiconductor package containing an integrated circuit chip having, on a front face, an optical sensor and electrical connection regions distributed about this sensor.

According to the invention, this method consists: in prefabricating a first plate having a recess and an assembly face lying around this recess, in prefabricating a second plate which has a recess and an assembly face lying around this recess into which an aperture opens via the bottom and which is fitted with external electrical connection tracks lying on this assembly face and in this recess so as to exhibit connection portions lying in the bottom of this recess, in prefabricating a transparent patch, the surface of which is lower than the surface surrounded by the said electrical connection regions of the chip, in fitting the assembly face with at least one of the said plates with a layer of adhesive, in placing the said plates one on the other by bringing their assembly faces together one on the other, by inserting the chip and the said patch between them such that the chip is engaged in the recess of the first plate and that the patch is engaged in the recess of the second plate and lies in front of the optical sensor of the chip and by inserting electrical connection pads between the electrical connection regions of the chip and the said connection portions of the said electrical connection tracks, and in exerting a pressure in the direction in which the said plates come together so as to compress the said layer of adhesive between their assembly faces, such that the said plates are fastened by activating the said layer of adhesive.

The method according to the invention may advantageously consist in fitting the said first plate with external electrical connection tracks lying on its assembly face in order to come in contact with the electrical connection tracks of the second plate.

The method according to the invention may advantageously consist in inserting strips of adhesive made of an electrically conductive material between the portions of the electrical connection tracks of the said plates, lying on their assembly faces.

The method according to the invention may advantageously consist in inserting an annular spacer lying between the chip and the patch and placed around the optical sensor of this chip.

The method according to the invention may advantageously consist in inserting an annular layer of adhesive between the transparent patch and the wall of the recess of the second plate.

The subject of the present invention is also an optical semiconductor package containing an integrated circuit chip exhibiting on a front face an optical sensor and electrical connection regions distributed about this sensor.

According to the invention, this package comprises a transparent patch lying in front of the front face of the chip without covering the electrical connection regions of the chip, plates defining between them a cavity in which the said chip and the said patch are stacked and having annular assembly faces, electrical connection pads placed between the said electrical connection regions and one face of the said cavity, electrical connection tracks carried by the plate located at the side of the said patch and lying on the said face of the cavity in order to be in contact with the said electrical connection pads, a layer of adhesive lying between the said assembly faces of the said plates, the said electrical connection tracks protruding in order to pass between the assembly faces of the said plates for the purpose of external connections and the plate located at the side of the said patch comprising an aperture located opposite the optical sensor.

According to the invention, the package preferably comprises an annular spacer lying between the said chip and the said transparent patch and located between the optical sensor and the electrical connection regions of this chip.

According to the invention, the plate located at the side of the said chip comprises auxiliary electrical connection tracks lying between the assembly faces of the said plates and in contact with the said tracks connected to the said electrical connection pads, between the said assembly faces.

According to the invention, strips of conductive adhesive are preferably inserted between the tracks of the said plates.

According to the invention, the said auxiliary tracks preferably protrude over the lateral face of the plate located at the side of the chip and on the external face of this plate opposite this chip.

According the invention, the package preferably comprises an annular layer of adhesive between the said transparent patch and the plate located at the side of this patch.

According to the invention, the said plates preferably respectively comprise recesses in which the said chip and the said transparent patch are engaged.

BRIEF DESCRIPTION OF THE DRAWINGS

The present invention will be better understood on studying an optical semiconductor package and its method of fabrication, described by way of non-limiting examples and illustrated by the drawing in which.

DETAILED DESCRIPTION OF PREFERRED EMBODIMENTS

Figure 1:
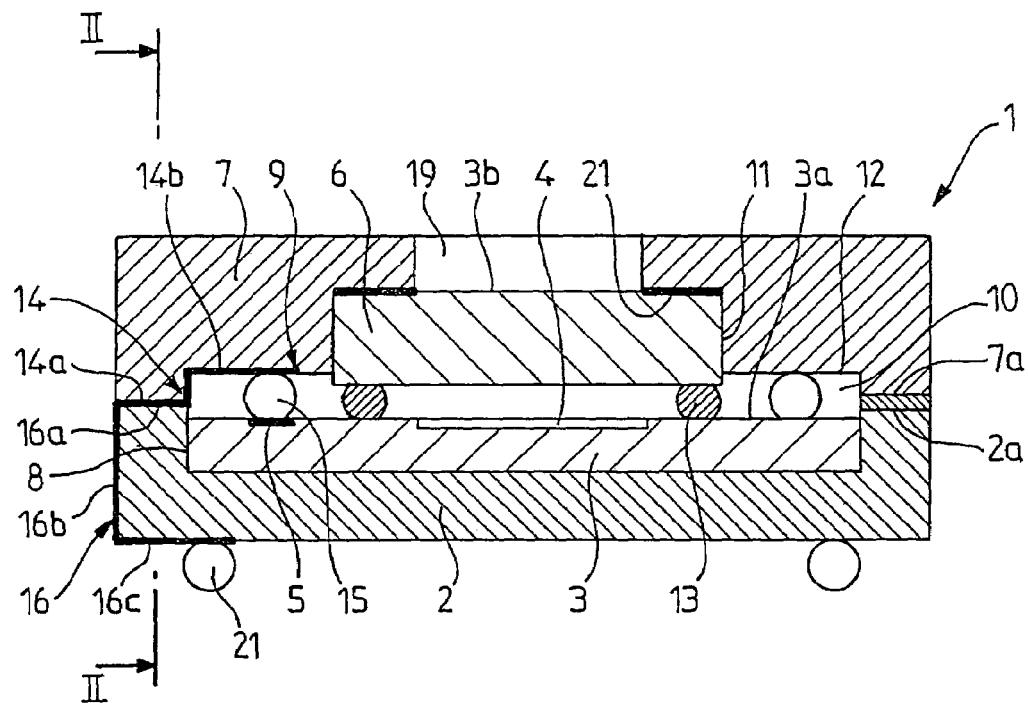
FIG. 1 shows an optical semiconductor package according to the present invention.
Figure 2:
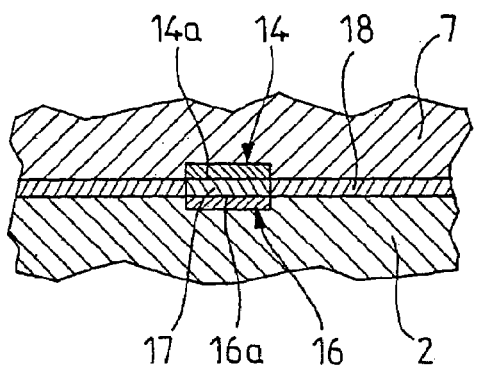
FIG. 2 shows a partial section along II—II of the optical semiconductor package of FIG. 1.

The optical semiconductor package 1 shown comprises a first plate 2, for example made of a thermoplastic, an integrated circuit chip 3 having a front face 3a comprising a central optical sensor 4 and electrical connection regions 5 distributed around and at some distance from this optical sensor 4, a transparent patch 6, the surface of which is above the surface of the optical sensor 4 but below the surface surrounded by the electrical connection regions 5, and the second plate 7 made of an insulating material, for example made of a thermoplastic.

The first plate 2 has a recess 8 and an assembly face 2a surrounding this recess and the second plate 7 has a recess 9 and an assembly face 7a surrounding this recess 9 such that the plates 2 and 7 can be fixed by their assembly faces 2a and 7a, thereby forming a cavity 10 between them.

The recess 8 of the first plate 2 is sized so as to be able to house the chip 3 in a position such that its front face 3a is oriented towards the second plate 7, its face 3b opposed to its front face 3a bearing against the bottom of the recess 8.

The recess 9 of the second plate 7 has a hollow 11 dimensioned so as to be able to house the transparent patch 6, the transparent patch 6 bearing against the bottom of this hollow 11 and the recess 9 having a face 12 surrounding the hollow 11 and lying so as to face, and at some distance from, the periphery of the front face 3a of the chip 3 including electrical connection regions 5.

The distance between the bottom of the recess 8 of the first plate 2 and the bottom of the hollow 11 of the recess 9 of the second plate 7 is such that the chip 3 and the transparent patch 6 are placed at some distance one from the other via a spacer 13 bearing on the front face 3a of the chip 3, between its optical sensor 4 and its electrical connections regions 5.

The second plate 7 carries a multiplicity of electrical connection tracks 14 which have portions 14a lying on its assembly face 7a and portions 14b which lie on the face 12 of its recess 9 and which are distributed so as to be connected to the electrical connection regions 5 of the chip 3 via protruding electrical connection pads consisting of balls or columns made of metal or of a conductive polymer.

The first plate 2 carries distributed electrical connection tracks 16 which have portions 16a placed opposite portions 14a of the tracks 14, portions 16b which lie on its lateral face and portions 16c which lie on its outer face opposite its recess 8.

Between the portions 14a of the tracks 14 of the second part 7 and the portions 16a of the tracks 16 carried by the first part 2, lie conductive adhesive strips 17.

Between the assembly faces 2a and 7a of the parts 2 and 7 lies a layer of non-conductive adhesive 18 bonding them, which is contiguous with the conductive adhesive strips 17.

The second plate 7 has an aperture 19 which opens into the bottom of the hollow 11 of its recess 9 such that the optical sensor 4 can receive the external light through this aperture 19, the transparent patch 6 and the space separating this transparent patch 6 and the front face 3a of the chip 3, thereby passing inside the annular spacer 13.

The optical semiconductor package 1 which has just been described can be fabricated as follows.

Figure 3:
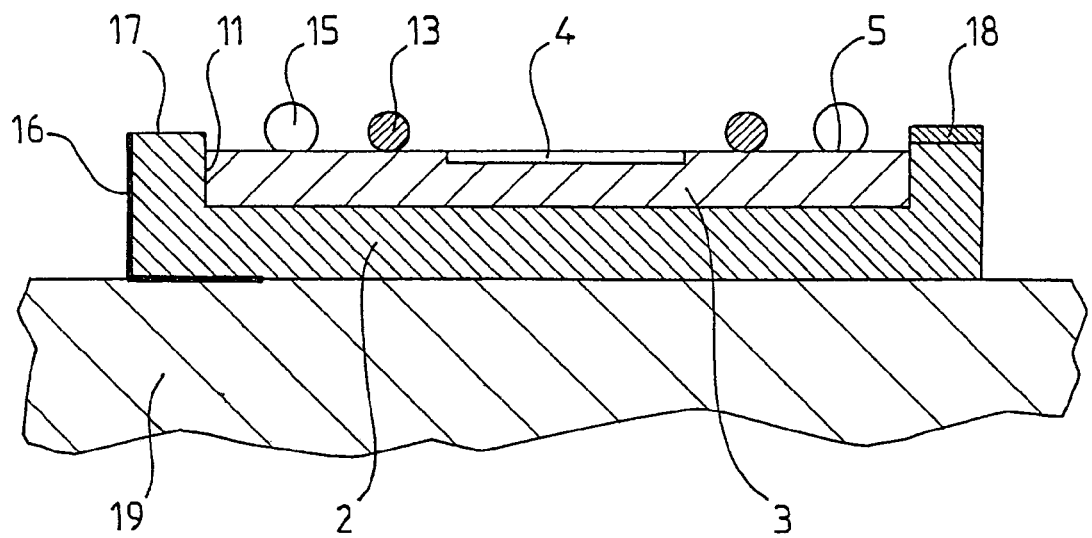
FIG. 3 shows the optical semiconductor package in an intermediate publication step.

As shown in FIG. 3, the first plate 2 is placed on a table 19 of a machine such that its recess 8 is oriented upwards, this plate 2 being fitted with electrical connection tracks 7, conductive adhesive strips 17 and the layer of non-conductive adhesive 18.

The chip 3 is placed in the recess 8 of the first plate 2 such that its front face 3a is turned upwards, with possible insertion of a layer of adhesive between the bottom of the recess 8 and the face of the chip 3 opposite its front face 3a.

The spacer 13 is placed on the front face 3a of the chip 3, between its optical sensor 4 and its electrical connection regions 5 and the electrical connection pads 15 are arranged on these electrical connection regions. In a variant, the spacer 13 and the pads 15 could be placed on the chip 3 before installing the latter on the plate 2.

Figure 4:
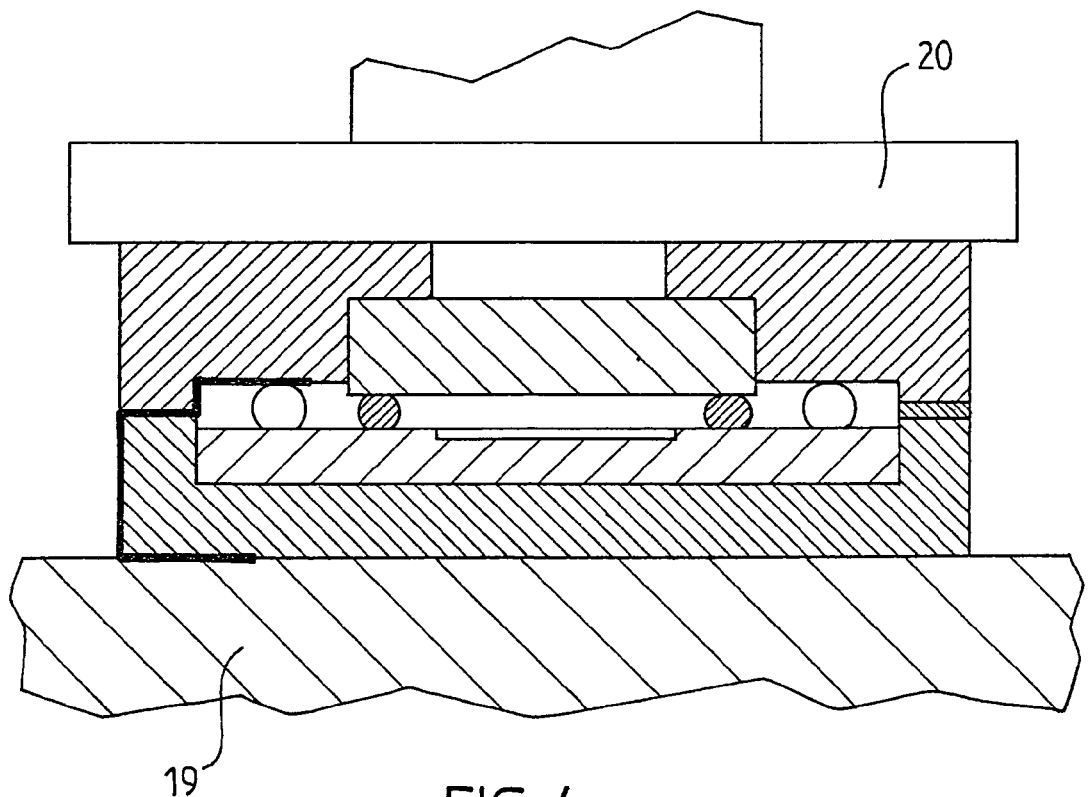
FIG. 4 shows the optical semiconductor package in a following fabrication step.

As shown in FIG. 4, the transparent patch 6 is then placed on the spacer 13.

The second plate 7 is placed on the first plate 2 such that the transparent patch 6 is engaged in the hollow 11 of its recess 9, as the electrical connection pads 15 come into contact with the connection portions 14b of these tracks 14 and that their assembly faces 2a and 7a are pressed together via the adhesive layer 18, the portions 14a and 16a of their electrical connection track 14 and 16 are pressed together via conductive adhesive strips 17.

By means of a pick-and-press head 20, possibly used to carry out the aforementioned placements, a pressure is exerted tending to bring the plates 2 and 7 together by compress the conductive adhesive strips 17 and the adhesive layer 18.

The conductive adhesive strips 17 and the adhesive layer 18 are then activated so as to fasten the plates 2 and 7 one to the other forming a sealed joint.

The adhesives 17 and 18 can be chosen so as to be activated either by simply exerting pressure or by an external means, for example consisting of a means of heating the table 10.

In a variant, advantageously it is possible to insert an annular layer of sealing adhesive 21 between the transparent patch 6 and the bottom of the hollow 11 of the recess 9 of the plate 7. In this case the spacer 13 could be omitted.

Preferably, the spacer 13 and the electrical connection pads 15 are chosen from materials exhibiting a degree of elasticity making it possible to absorb or to compensate for the crushing of the conductive adhesive strips 17 and of the non-conductive adhesive layer 18.

It follows from the foregoing that the optical semiconductor package 1 is obtained by sandwiching the chip 3 and the patch 6, spaced apart by the spacer 13, between the plates 2 and 7 and sandwiching the electrical connection pads 15 between the frontal face 3a of the chip 3 and the face 12 of the recess 9 of the plate 7, the plates 2 and 7 being fastened by inserting conductive adhesive strips 17 and the conductive layer 18 between their assembly faces 2a and 7a. This sandwiching furthermore ensures isolation of the chip 3 with respect to the outside and the protection, especially mechanical protection, of its optical sensor 4.

After the aforementioned fabrication steps, electrical connection pads 21, consisting for example of balls, are placed on the portions 16c of the tracks 16 of the first plate 2 with a view to later electrical connections of the package 1.

The present invention is not limited to the example described above. Many variant embodiments are possible without departing from the scope defined by the appended claims.

What is claimed is:

1. A method of fabricating an optical semiconductor package containing an integrated circuit chip that has an optical sensor and electrical connection regions on a front face, said method comprising the steps of:

prefabricating a first plate that includes a first recess and a first assembly face located around the first recess;

prefabricating a second plate that includes external electrical connection tracks, an aperture, a second recess, and a second assembly face located around the second recess, the aperture opening into a bottom of the second recess and the external electrical connection tracks including portions located on the assembly face and portions located in the bottom of the second recess;

prefabricating a transparent patch;

providing at least one of the first and second assembly faces with a layer of adhesive;

placing the first and second plates together such that:

the first assembly face faces the second assembly face, the integrated circuit chip and the transparent patch are positioned between the first and second plates with the integrated circuit chip being engaged in the first recess of the first plate, with the transparent patch being engaged in the second recess of the second plate, and with the transparent patch being positioned in front of the optical sensor of the integrated circuit chip, and electrical connection pads electrically couple, the electrical connection regions of the integrated circuit chip with the electrical connection track portions located in the bottom of the second recess; and exerting pressure in a direction in which the first and second plates come together to compress the layer of adhesive between the first and second assembly faces, so as to activate the layer of adhesive to fasten the first and second plates.

2. The method according to claim 1, wherein the step of prefabricating the first plate includes the sub-step of providing the first plate with external electrical connection tracks located on the first assembly face for electrically coupling with the electrical connection tracks of the second plate.

3. The method according to claim 2, further comprising the step of providing adhesive strips made of an electrically conductive material for electrically connecting the electrical connection tracks on the first assembly face of the first plate with the electrical connection tracks on the second assembly face of the second plate when the first and second plates are placed together.

4. The method according to claim 3, further comprising the step of providing an annular spacer between the integrated circuit chip and the transparent patch, the spacer being positioned around the optical sensor of the integrated circuit chip.

5. The method according to claim 1, further comprising the step of providing an annular spacer between the integrated circuit chip and the transparent patch, the spacer being positioned around the optical sensor of the integrated circuit chip.

6. The method according to claim 5, further comprising the step of providing an annular layer of adhesive between the transparent patch and a wall of the second recess of the second plate.

7. The method according to claim 1, further comprising the step of providing an annular layer of adhesive between the transparent patch and a wall of the second recess of the second plate.

* * * * *